(12) United States Patent
Coffey et al.

(10) Patent No.: US 11,271,678 B2
(45) Date of Patent: Mar. 8, 2022

(54) ENCODING METHOD, RELATED TRANSMITTER APPARATUS AND RELATED RECEIVER APPARATUS FOR WIRELESS LOCAL AREA NETWORK

(71) Applicant: Realtek Semiconductor Corp., HsinChu (TW)

(72) Inventors: John Timothy Coffey, San Francisco, CA (US); Der-Zheng Liu, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 16/920,390

(22) Filed: Jul. 2, 2020

(65) Prior Publication Data
US 2021/0226728 A1     Jul. 22, 2021

Related U.S. Application Data

(60) Provisional application No. 62/963,545, filed on Jan. 21, 2020.

(51) Int. Cl.
| | | |
|---|---|---|
| H03M 13/00 | (2006.01) | |
| H04L 1/00 | (2006.01) | |
| H03M 13/29 | (2006.01) | |
| H03M 13/15 | (2006.01) | |
| H03M 13/11 | (2006.01) | |
| H04W 84/12 | (2009.01) | |

(52) U.S. Cl.
CPC ....... *H04L 1/0057* (2013.01); *H03M 13/1102* (2013.01); *H03M 13/1515* (2013.01); *H03M 13/2906* (2013.01); *H04W 84/12* (2013.01)

(58) Field of Classification Search
None
See application file for complete search history.

(56) References Cited

U.S. PATENT DOCUMENTS

| | | | |
|---|---|---|---|
| 2006/0150067 A1 | 7/2006 | Kanasugi | |
| 2007/0011013 A1* | 1/2007 | Liebchen | G10L 19/167 704/500 |
| 2009/0086849 A1* | 4/2009 | Tsai | H04L 1/005 375/298 |
| 2009/0199062 A1* | 8/2009 | Shen | H04L 1/0067 714/748 |
| 2009/0271688 A1* | 10/2009 | Jiang | H03M 13/1117 714/784 |
| 2010/0232338 A1* | 9/2010 | Krishnamoorthi | H04L 1/0071 370/312 |

(Continued)

OTHER PUBLICATIONS

T. Takata, T. Fujiwara, T. Kasami and S. Lin, "An error control system with multiple-stage forward error corrections," in IEEE Transactions on Communications, vol. 38, No. 10, pp. 1799-1809, Oct. 1990, doi: 10.1109/26.61451. (Year: 1990).*

(Continued)

*Primary Examiner* — Daniel F. McMahon
(74) *Attorney, Agent, or Firm* — Winston Hsu

(57) ABSTRACT

An encoding method for a wireless local area network includes encoding a packet via a cyclic coding scheme into a first amount of multiple first blocks; processing each of the first amount of the first blocks into a second amount of multiple second blocks; and encoding the second amount of the second blocks via a block coding scheme.

16 Claims, 2 Drawing Sheets

(56) References Cited

U.S. PATENT DOCUMENTS

| | | | | |
|---|---|---|---|---|
| 2011/0093762 A1* | 4/2011 | Kwon | ................... | H03M 13/09 |
| | | | | 714/758 |
| 2012/0063533 A1* | 3/2012 | Fonseka | ............ | H04L 25/03171 |
| | | | | 375/295 |
| 2012/0314801 A1* | 12/2012 | Oh | .......................... | H04B 7/08 |
| | | | | 375/295 |
| 2013/0058431 A1* | 3/2013 | Fonseka | ................ | H04L 1/0065 |
| | | | | 375/295 |
| 2014/0365848 A1* | 12/2014 | Roh | ................. | H03M 13/2966 |
| | | | | 714/784 |
| 2016/0344492 A1* | 11/2016 | Mouhouche | ...... | H03M 13/2707 |
| 2017/0272188 A1 | 9/2017 | Ko | | |

OTHER PUBLICATIONS

Andreas F. Molisch, "Wireless Local Area Networks," in Wireless Communications , IEEE, 2011, pp. 731-750, doi: 10.1002/ 9781119992806.ch29. (Year: 2011).*

\* cited by examiner

ENCODING METHOD, RELATED TRANSMITTER APPARATUS AND RELATED RECEIVER APPARATUS FOR WIRELESS LOCAL AREA NETWORK

CROSS REFERENCE TO RELATED APPLICATIONS

This application claims the benefit of U.S. Provisional Application No. 62/963,545 filed on Jan. 21, 2020, the contents of which are incorporated herein in their entirety.

BACKGROUND OF THE INVENTION

1. Field of the Invention

The present disclosure relates to an encoding method, related transmitter apparatus and related receiver apparatus for a wireless local area network, and more particularly, to an encoding method, related transmitter apparatus and related receiver apparatus capable of mitigating interferences in the wireless local area network.

2. Description of the Prior Art

In conventional field of wireless local area networks, e.g., networks based on IEEE 802.11, a common source of packet transmission failure is the presence of interference from other wireless transmissions. That is, while IEEE 802.11 and other wireless networking systems have mechanisms that regulate access to the wireless medium, it is known that high transmission quality with no harmful interference is not guaranteed. When a transmitter chooses a significantly lower data rate (e.g., higher fraction of check bits), and hence a longer packet duration, it increases the probability that harmful interference occurs while the packet is being transmitted. Accordingly, if the transmitter instead keeps the overall packet duration the same and fixed overheads per packet, the system throughput will be decreased. Therefore, improvements are necessary to the prior art.

SUMMARY OF THE INVENTION

The present disclosure provides an encoding method, related transmitter apparatus and related receiver apparatus for a wireless local area network to mitigate interferences in the wireless local area networks.

An embodiment of the present disclosure provides an encoding method for a wireless local area network. The encoding method includes the following steps: encoding a packet via a cyclic coding scheme into a first amount of multiple first blocks; processing each of the first amount of the first blocks into a second amount of multiple second blocks; and encoding the second amount of the second blocks via a block coding scheme.

Another embodiment of the present disclosure provides a transmitter apparatus for a wireless local area network. The transmitter apparatus includes an outer encoder and an inner encoder. The outer encoder is configured to encode a packet via a cyclic coding scheme into a first amount of multiple first blocks and process each of the first amount of the first blocks into a second amount of multiple second blocks. The inner encoder is configured to encode the second amount of the second blocks via a block coding scheme.

Another embodiment of the present disclosure provides a receiver apparatus for a wireless local area network. The receiver apparatus includes an inner decoder and an outer decoder. The inner decoder is configured to decode a packet via a block coding scheme into a plurality of block codes. The outer decoder is configured to decode the plurality of block codes via a cyclic coding scheme.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
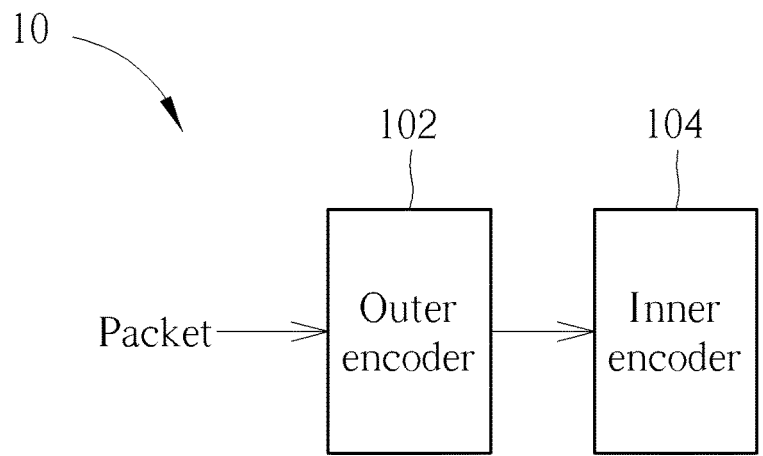
FIG. 1 is a schematic diagram of a transmitter apparatus according to an embodiment of the present disclosure.

FIG. 1 is a schematic diagram of a transmitter apparatus 10 according to an embodiment of the present disclosure. The transmitter apparatus 10 may be a wireless base station of the Wireless Local-Area Network (WLAN). The transmitter apparatus 10 of the present disclosure utilizes a two-level coding scheme, which includes an outer encoder 102 and an inner encoder 104. The outer encoder 102 is configured to encode a packet via a cyclic coding scheme into a first amount of a plurality of first blocks and process each of the first amount of the plurality of first blocks into a second amount of a plurality of second blocks. In an embodiment, the outer encoder 102 may perform encoding via the cyclic code encoding scheme or other block code encoding schemes. The inner encoder 104 is configured to encode the second amount of the second blocks via a block coding scheme. For example, the block coding scheme may be a low-density parity-check (LDPC) coding scheme or a Reed-Solomon (RS) coding scheme. With the combination of the encoding schemes by the outer encoder 102 and the inner encoder 104, the present disclosure enables mitigation of mid-packet interference via forward error correction, in which the mid-packet denotes a packet after preamble is over.

Figure 2:
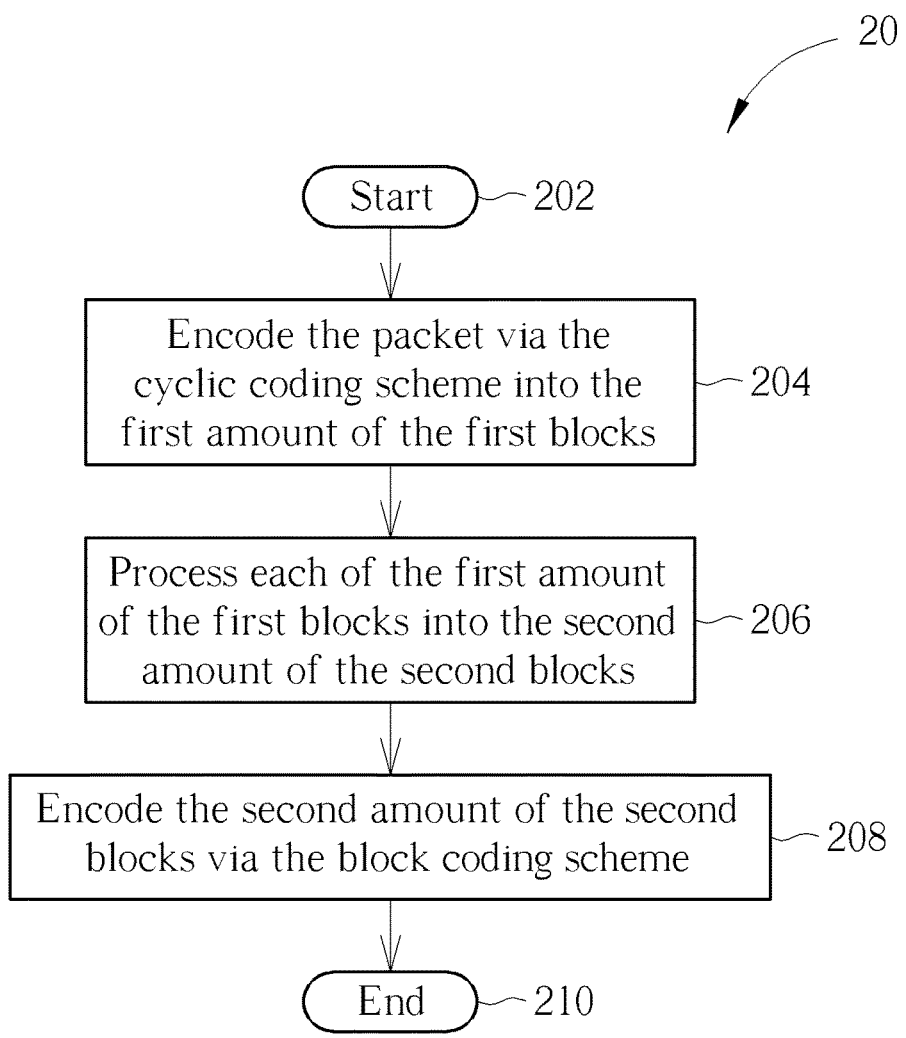
FIG. 2 is a schematic diagram of an encoding method according to an embodiment of the present disclosure.

An operation of the transmitter apparatus 10 of the present disclosure may be concluded to an encoding method 20. Reference is made to FIG. 2. FIG. 2 is a schematic diagram of the encoding method 20 according to an embodiment of the present disclosure. The encoding method 20 is executed by the transmitter apparatus 10, and includes the following steps:

Step 202: Start.

Step 204: Encode the packet via the cyclic coding scheme into the first amount of the first blocks.

Step 206: Process each of the first amount of the first blocks into the second amount of the second blocks.

Step 208: Encode the second amount of the second blocks via the block coding scheme.

Step 210: End.

Before step 204, the outer encoder 102 may segment the packet into a plurality of first subblocks with at least one leftover bit, in which the at least one leftover bit is padded with at least one leading digital 0.

In an embodiment, it is assumed that the transmitter apparatus 10 is configured to process a packet of 300,000 data bits, and the packet of 300,000 data bits may be segmented into 689 blocks of 435 bits each with 285 bits leftover. The leftover 285 bits are padded with leading 0's to generate a 690th block of 435 bits. Notably, the packet size is not limited to 300,000 data bits, other packet sizes, e.g., a packet of 900,000 bits, may be divided into three blocks of 300,000 bits for encoding. In addition, a bit length (i.e., 435 bits of each of the first subblocks) of each of the first subblocks is related to a maximal consecutive correctable codewords for decoding.

Each of the first subblocks are segmented into a plurality of second subblocks with at least a leftover subblock, and the leftover subblocks are padded with at least one leading digital 0 to generate the first amount of the plurality of first blocks to correspond to a highest exponent in a polynomial notation of the cyclic coding scheme.

In the example of encoding the packet of 300,000 bits, each of the 690 blocks with 435 bits are segmented into 43 sets of 16 subblocks of 435 bits and 2 leftover subblocks. The 2 leftover subblocks are padded with leading digital 0's to be a 44th set of subblock. Therefore, there are 44 sets of 16 subblocks, and each set includes 16*435=6960 bits.

A cyclic code length applied in the embodiment is 8191 (i.e., $8191=2^{13}-1$), the polynomial $x^{8191}-1$ factors over a finite field GF(2) into x−1 and all 630 irreducible polynomials of degree 13, which are denoted $p_1(x), p_2(x), \ldots, p_{630}(X)$ herein. A generator polynomial of the cyclic code encoding scheme is $g(x)=p_1(x)*p_2(x)* \ldots *p_{67}(x)$ with a degree of 67*13=871. Taking one of the 16 subblocks of 435 bits to polynomial notation gives a polynomial i(x) of degree up to 16*435−1=6959, and multiplying by the generator polynomial g(x) gives a polynomial of degree up to 6959+ 871=7830. Notably, the degree (i.e., 871) of the generator polynomial of the cyclic code encoding scheme is around two times of the bit length of the first subblocks, i.e., 435 bits (i.e., 2*435=870) in this embodiment.

Then, 360 0's are appended to the left of each of the 16 subblocks (i.e., 44 sets of 6960+360=7320 bits) to correspond to the highest exponents in polynomial notation for the cyclic code encoding scheme, so as to generate the polynomial of degree of 8190 with the generator polynomial of the degree 871, which corresponds to a bit pattern of 8191 bits. Such pattern forms a cyclic code of length 8191 bits. That is, each cyclic shift of a codeword is also a codeword.

In step 204, the packet is encoded into the first amount of the first blocks via the cyclic coding scheme. That is, the packet of 300,000 bits is processed into 44 sets of 7320 bits for the cyclic coding.

In step 206, each of the first amount of the first blocks are processed into the second amount of the second blocks. In detail, the first amount of the plurality of first blocks are segmented into the second amount of the second blocks, each of the second amount of the plurality of second blocks is divided and padded with a least a leading digital 0.

In the example of encoding the packet of 300,000 bits, the 8191 bits in each cyclic code are segmented into 17 blocks with at most 488 bits under a data rate 3/4 and a block length 672 of the LDPC codeword, to keep the blocks as evenly as possible, in which 17 blocks are rounded up from 8191/488=16.78. 14 of the 17 blocks are of 482 bits, and 3 of the 17 blocks are of 481 bits. All 17 blocks are padded up to 488 bits by adding leading 0's. In an embodiment, a 16-bit cyclic redundancy check is added to each block thereon such that each block has 504 bits.

In step 208, the second amount of the second blocks are encoded via the block coding scheme. In an embodiment, the second blocks are encoded via LDPC encoding scheme with the data rate 3/4 and the block length 672 LDPC codeword. Each block of 504 bits are encoded by the LDPC code to generate a block of 672 bits, and the 672 bits LDPC codewords are interleaved. Accordingly, first LDPC codeword from cyclic code 1 is generated, followed by the first LDPC codeword of cyclic code 2, and so on.

The resulting bit sequence is mapped to modulation symbols and subcarriers for an IEEE 802.11 transmission of the wireless local area network, and the packet is then transmitted via the transmitter apparatus 10.

Notably, the LDPC code with data rates 1/2, 5/8 and 13/16 respectively of block length of 672 bits, or the LDPC code with data rate 7/8 of block length of 624 bits, are all applicable to the present disclosure.

Therefore, in the above embodiments, the interference is confined in time so that for each of the constituent cyclic codewords, the interference with ambient receiver noise, and other sources of error causes no more than two consecutive invalid LDPC codewords. That is, a receiver apparatus is able to fully decode the packet, and thus to mitigate the interference successfully.

Figure 3:
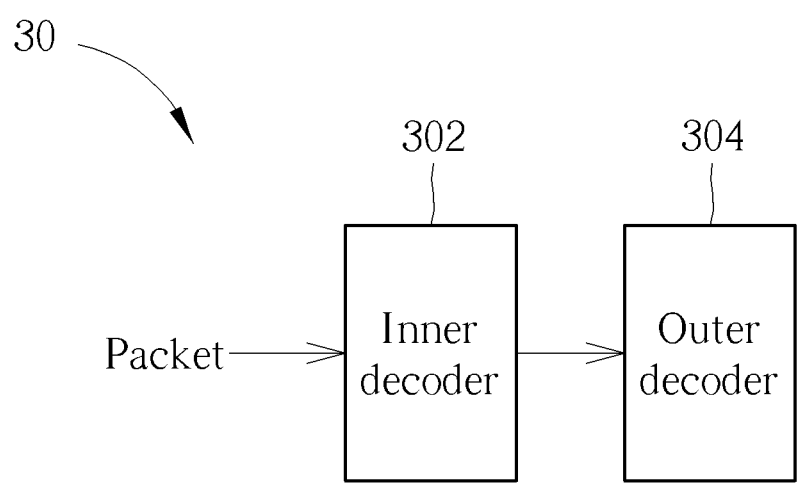
FIG. 3 is a schematic diagram of a receiver apparatus according to an embodiment of the present disclosure.

Referring to a decoding process corresponding to the encoding method 20, in a preferable embodiment, a receiver apparatus is configured to demodulate signal and decode each LDPC codeword, wherein the decoding scheme is not limited herein. FIG. 3 is a schematic diagram of a receiver apparatus 30 according to an embodiment of the present disclosure. The receiver apparatus 30 includes an inner decoder 302 and an outer decoder 304, which may be a wireless base station of WLAN for receiving packets from a transmitter apparatus. In an embodiment, after the receiver apparatus 30 receives a packet which is encoded by the transmitter apparatus 10, the inner decoder 302 of the receiver apparatus 30 decodes each LDPC codeword of 672 bits, and the corresponding 504 bits are derived, which includes a 16-bit CRC checksum. The inner decoder 302 of the receiver apparatus 30 then checks the 16-bit CRC checksum to verify whether the decoded LDPC codeword is valid or not.

When some decoded LDPC codewords are not valid, the outer decoder 304 of the receiver apparatus 30 arranges the decoded LDPC codewords corresponding to each cyclic code into a shift register. By shifting the bits in the shift register, or otherwise, the receiver apparatus 30 finds a shift in which all bits in an information portion of the shift register correspond to valid LDPC codewords. In this case, since the decoded code is cyclic, full original cyclic codeword can readily be reconstructed from the information portion, i.e., errors are trapped.

Because of the interleaving of the LDPC codewords, the 17 blocks of LDPC codewords corresponding to one cyclic code of length 8191 bits will be distributed approximately evenly throughout the transmitted packet, all cyclic codewords with invalid LDPC codewords are confined to at most two consecutive LDPC codewords in the embodiment. That is, the cyclic code will be able to find a set of 15 consecutive valid LDPC codewords, and decode them correctly.

If the interference affects no more than two such LDPC codewords, the outer decoder 304 of the receiver apparatus 30 decodes the cyclic code of length 8191. Since there are two blocks of 435 bits that are flagged by the CRC as invalid, 2*435=870 bits are corresponded to invalid bits. Because 870 bits is less than the redundancy of the cyclic code (i.e., 871 bits), it is possible to find a cyclic shift where all the invalid bits are in the redundancy section, and hence the invalid bits may be detected and corrected using error trapping. Therefore, a maximal consecutive correctable amount for decoding the codewords is related to the bit length of the first subblocks and the degree of the generator polynomial of the cycle encoding scheme.

In this embodiment, the receiver apparatus 30 is capable of decoding arbitrarily severe interference, provided that the interference spans a fraction of no more than about 5% of the overall duration of the packet, since the cyclic codes have redundancy parity checks of 871/8191, or a little over 10%, without accounting for padding. The effect of a burst of interference of a given duration will depend on a specific start time of the interference and the mapping of LDPC codewords to frequency tones.

In an embodiment, the receiver apparatus 30 corresponding to the transmitter apparatus 10 may correct bursts of up to 10% of the length of the packet, since it has redundancy of about 10% of the duration of the packet, and about half of 10% in the worst case, i.e., about 5% of the duration of the packet. If the overall duration of the packet is 2 ms, for example, bursts of up to 100 μs may be corrected, and even up to 200 μs in some circumstances. Such durations are long enough to protect against transmissions by neighboring devices of acknowledgment (ACK) frames, request-to-send (RTS), clear-to-send (CTS) frames, and other short frames.

Notably, the bit number of the packet, the degree and the factors of the generator polynomial of the cyclic coding scheme, a different CRC code or no CRC code, a different cyclic code, the packets of different durations, data rates and target burst durations of the above embodiments may be modified according to different requirements or variations in interleaving of LDPC codewords before mapping to the modulation symbols, e.g., the LDPC codewords could be taken two or more at a time, which all belong to the scope of the present disclosure.

In summary, the present disclosure provides an encoding method and related transmitter apparatus for a wireless local area network, which enables an error trapping shift register sequence decoding algorithm for the outer encoder to detect and correct long bursts of errors that are left over after the inner code has been decoded to mitigate interferences in the wireless local area networks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An encoding method for a wireless local area network, comprising:
    encoding a packet via a cyclic coding scheme into a first amount of a plurality of first blocks;
    processing each of the first amount of the plurality of first blocks into a second amount of a plurality of second blocks; and
    encoding the second amount of the plurality of second blocks via a block coding scheme;
    wherein the step of encoding the packet via the cyclic coding scheme into the first amount of the plurality of first blocks comprises:
       segmenting the packet into a plurality of first subblocks with at least a leftover bit, wherein the at least a leftover bit is padded with at least a leading digital 0.

2. The encoding method of claim 1, wherein the step of encoding the packet via the cyclic coding scheme into the first amount of the plurality of first blocks further comprises:
    segmenting each of the plurality of first subblocks into a plurality of second subblocks with at least a leftover subblock; and
    padding the plurality of second subblocks with at least a leading digital 0 to generate the first amount of the plurality of first blocks, wherein a bit pattern of the plurality of first blocks is corresponded to a highest exponent in a polynomial notation of the cyclic coding scheme.

3. The encoding method of claim 2, wherein a bit length of plurality of first subblocks and a degree of a generator polynomial of the cyclic coding scheme is related to a maximal consecutive correctable amount for decoding.

4. The encoding method of claim 1, wherein the step of processing each of the first amount of the plurality of first blocks into the second amount of the plurality of second blocks comprises:
    segmenting the first amount of the plurality of first blocks into the second amount of the plurality of second blocks; and
    padding each of the second amount of the plurality of second blocks with at least a leading digital 0.

5. The encoding method of claim 1, wherein at least a cyclic redundancy check bit is padded to each of the second amount of the plurality of second blocks before the block coding scheme.

6. The encoding method of claim 1, wherein the block coding scheme is a low-density parity-check (LDPC) coding scheme or a Reed-Solomon (RS) coding scheme.

7. A transmitter apparatus for a wireless local area network, comprising:
    an outer encoder, configured to encode a packet via a cyclic coding scheme into a first amount of a plurality of first blocks and process each of the first amount of the plurality of first blocks into a second amount of a plurality of second blocks and to segment the packet into a plurality of first subblocks with at least a leftover bit, wherein the at least a leftover bit is padded with at least a leading digital 0; and
    an inner encoder, configured to encode the second amount of the plurality of second blocks via a block coding scheme.

8. The transmitter apparatus of claim 7, wherein the outer encoder is further configured to segment each of the plurality of first subblocks into a plurality of second subblocks with at least a leftover subblock, and pad the plurality of second subblocks with at least a leading digital 0 to generate the first amount of the plurality of first blocks, wherein a bit pattern of the plurality of first blocks is corresponded to a highest exponent in a polynomial notation of the cyclic coding scheme.

9. The transmitter apparatus of claim 8, wherein a bit length of plurality of first subblocks and a degree of a generator polynomial of the cyclic coding scheme is related to a maximal consecutive correctable codewords for decoding.

10. The transmitter apparatus of claim 7, wherein the outer encoder is configured to segment the first amount of the plurality of first blocks into the second amount of the plurality of second blocks and pad each of the second amount of the plurality of second blocks with at least a leading digital 0.

11. The transmitter apparatus of claim 7, wherein at least a cyclic redundancy check bit is padded to each of the second amount of the plurality of second blocks before the block coding scheme.

12. The transmitter apparatus of claim 7, wherein the block coding scheme is a low-density parity-check (LDPC) coding scheme or a Reed-Solomon (RS) coding scheme.

13. A receiver apparatus for a wireless local area network, comprising:
- an inner decoder, configured to decode a packet via a block coding scheme into a plurality of block codes; and
- an outer decoder, configured to decode the plurality of block codes via a cyclic coding scheme;
- wherein a degree of a generator polynomial of the cyclic coding scheme corresponds to a maximal consecutive correctable codewords for decoding.

14. The receiver apparatus of claim 13, wherein the inner encoder is configured to verify the decoded block code of the plurality of block codes of the packet by checking a checksum of the decoded block code.

15. The receiver apparatus of claim 13, wherein when the block code of the plurality of block codes of the packet is not valid, the outer decoder is configured to arrange the packet, which is not valid, into a shift register corresponding to a cyclic code of the cyclic coding scheme.

16. The receiver apparatus of claim 13, wherein the block coding scheme is a low-density parity-check (LDPC) coding scheme or a Reed-Solomon (RS) coding scheme.

\* \* \* \* \*